(12) United States Patent
Pedenon et al.

(10) Patent No.: US 8,418,094 B2
(45) Date of Patent: *Apr. 9, 2013

(54) METHODS, SYSTEMS, AND COMPUTER PROGRAM PRODUCT FOR PARALLELIZING TASKS IN PROCESSING AN ELECTRONIC CIRCUIT DESIGN

(75) Inventors: Arnaud Pedenon, Antibes (FR); Philippe Lenoble, Grasse (FR); Claire Nauts, Grasse (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/324,933

(22) Filed: Dec. 13, 2011

(65) Prior Publication Data

US 2012/0089954 A1 Apr. 12, 2012

Related U.S. Application Data

(60) Division of application No. 12/347,954, filed on Dec. 31, 2008, now Pat. No. 8,099,693, which is a continuation of application No. 61/111,303, filed on Nov. 4, 2008.

(51) Int. Cl.
*G06F 17/50* (2006.01)
(52) U.S. Cl.
USPC ........... 716/103; 716/101; 716/105; 716/106; 703/14
(58) Field of Classification Search .................. 716/101, 716/103, 105–106; 703/14
See application file for complete search history.

(56) References Cited

U.S. PATENT DOCUMENTS

| | | | | |
|---|---|---|---|---|
| 5,602,754 | A * | 2/1997 | Beatty et al. | 716/108 |
| 6,080,204 | A * | 6/2000 | Mendel | 716/103 |
| 6,292,929 | B2 * | 9/2001 | Scepanovic et al. | 716/118 |
| 6,421,809 | B1 * | 7/2002 | Wuytack et al. | 716/132 |
| 6,519,743 | B1 | 2/2003 | Nauts et al. | |
| 6,708,313 | B2 * | 3/2004 | Pfeil et al. | 716/102 |
| 6,895,115 | B2 * | 5/2005 | Tilton | 382/180 |
| 7,143,020 | B1 | 11/2006 | Pedenon | |
| 7,159,217 | B2 | 1/2007 | Pulsipher et al. | |
| 7,389,453 | B2 * | 6/2008 | Udell | 714/724 |

(Continued)

OTHER PUBLICATIONS

Sundaram et al.; "T-Algorithm-Based Logic Simulation on Distributed Systems Sundaram"; IEEE Conference; VLSI; 1992; pp. 191-195.*

(Continued)

*Primary Examiner* — Naum Levin
(74) *Attorney, Agent, or Firm* — Vista IP Law Group, LLP

(57) ABSTRACT

Disclosed are a method, a system, and a computer program product for implementing compact manufacturing model during various stages of electronic circuit designs. In some embodiments, the method loads the full design database information on the master; distributes the tasks to be processed in parallel; loads a full design on a master; spawns a plurality of slave sessions; sends to at least one slave a nutshell representation of the electronic circuit design; identifies a task to perform in parallel and sends the task to be performed in parallel; and receives execution results or processing results from some of the plurality of slaves and updates one or more databases to incorporate the execution or processing results. In some embodiments, the method allows speeding up the applications without major rewrite without a need for design partition, and without memory penalty.

20 Claims, 10 Drawing Sheets

U.S. PATENT DOCUMENTS

| | | |
|---|---|---|
| 7,409,656 B1 | 8/2008 | Ruehl |
| 7,606,698 B1 | 10/2009 | Elmufdi et al. |
| 7,657,856 B1 | 2/2010 | Koshy et al. |
| 7,827,017 B2 | 11/2010 | Kundert |
| 7,904,852 B1 | 3/2011 | Cadouri et al. |
| 7,913,194 B1 | 3/2011 | Baylor |
| 7,913,206 B1 | 3/2011 | Cadouri |
| 8,010,917 B2 | 8/2011 | Cross et al. |
| 8,099,693 B2 * | 1/2012 | Pedenon et al. .............. 716/103 |
| 2003/0192013 A1 * | 10/2003 | Cote et al. .......................... 716/2 |
| 2004/0261058 A1 | 12/2004 | Kundert |
| 2008/0127000 A1 * | 5/2008 | Majumder et al. ................ 716/2 |
| 2009/0172623 A1 | 7/2009 | Cross et al. |
| 2009/0313596 A1 * | 12/2009 | Lippmann et al. ............. 716/12 |
| 2010/0115478 A1 | 5/2010 | Pedenon et al. |

OTHER PUBLICATIONS

U.S. Appl. No. 11/479,600, filed Jun. 30, 2006.
U.S. Appl. No. 11/965,695, filed Dec. 27, 2007.

* cited by examiner

METHODS, SYSTEMS, AND COMPUTER PROGRAM PRODUCT FOR PARALLELIZING TASKS IN PROCESSING AN ELECTRONIC CIRCUIT DESIGN

CROSS-REFERENCE TO RELATED APPLICATION(S)

This patent application is a divisional application of U.S. patent application Ser. No. 12/347,954, now U.S. Pat. No. 8,099,693 which was filed on Dec. 31, 2008 and entitled "METHODS, SYSTEMS, AND COMPUTER PROGRAM PRODUCT FOR PARALLELIZING TASKS IN PROCESSING AN ELECTRONIC CIRCUIT DESIGN". The U.S. patent application Ser. No. 12/347,954, now U.S. Pat. No. 8,099,693, further claims the benefit of U.S. Provisional Application Ser. No. 61/111,303, filed on Nov. 4, 2008, entitled METHODS, SYSTEMS, AND COMPUTER PROGRAM PRODUCT FOR PARALLELIZING TASKS IN PROCESSING AN ELECTRONIC CIRCUIT DESIGN. The content of the U.S. patent application Ser. No. 12/347,954, now U.S. Pat. No. 8,099,693, and U.S. Provisional Application Ser. No. 61/111,303 is hereby incorporated by reference in its entirety for all purposes.

BACKGROUND

The invention relates to technologies and techniques for integrated circuit ("IC") design.

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. Extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools. Compaction is an example of a tool used to modify a layout in order to make it more suitable for manufacturing.

Designers often use a set of tools to design a chip from its RTL description to its layout implementation. Among these tools, one of the goals of the physical implementation tools is to optimize a chip up to its targeted functional frequency as specified by the designer while taking into account the physical data available from tools such as the placement and route tools. As electronic designs become larger, speeding up the physical implementation process runtime becomes a more important task.

Optimizing a design consists of modifying the database of the chip to meet the timing constraint specified by designers. The optimization engine identifies the most relevant timing paths to optimize and iterates over the instances along these timing paths. For each instance, it applies different actions to improve the slack on the critical path. Most usual known optimization actions are resizing, restructuring, buffering, and moving instances. These actions are normally computation intensive because the timing accuracy which relates to the timing graph, the RC extraction, routing estimation, etc. is usually required or mandatory.

Most of the existing computer systems deployed for physical implementation of an electronic design or optimizing tasks comprise single-core single or multiple central processing units (CPUs), and as a result, most of the existing physical implementation tools or optimizers or physical optimization schemes have been designed for such single-core systems. As a result, the heuristics and algorithms are more likely designed and tuned under the assumption that these physical implementation or physical optimization systems have single-core CPUs. Furthermore, the infrastructures used by these single-core systems, such as the database editing, timing engine, the placement or incremental placement tools, and the post-placement optimization tools are therefore usually not thread safe. This non-thread safe environment often makes the task of having a multi-thread optimization almost economically impossible.

One of the concerns is that the optimization process may be dynamic. That is, when a move optimization has been committed, the process may also modify some physical data and the next timing path to optimize and may be completely different from other optimization processes. In an ideal world, one solution may have several threads working in parallel on different independent parts of the design. This may be possible only when all underlying applications are thread-safe. That is, when two or more threads are configured to share the same region(s) of the physical memory, one thread is aware what other threads are doing to the same region(s) of physical memory.

In some cases, this parallel processing requires one thread to know whether or not another thread sharing the same region(s) of the physical memory is accessing the same region (s) of the physical memory, or particularly, whether another thread is writing to or modifying the content of the same region(s) of the physical memory. Nonetheless, making typical non-thread safe electronic design automation (EDA) implementation tool thread safe often requires rewriting various programs of the tool to some extent. This kind of effort to make a non-thread safe electronic design automation tool thread safe means to focus several experts for several years to rewrite the application and its dependencies (database, core timing engine, router, placer, etc. . . . ). That is, it may be difficult to implement parallelism on existing EDA tools because it often requires revamping part of the tools such as the core engine and because it also implicitly requires a thread-safe infrastructure which most, if not all such current tools do not have.

There exist two conventional approaches both of which retain a master-slave general architecture. The first approach consists of finding a smart partition of the problem and distributes independent tasks to several CPUs. This first approach usually implies the task execution to last a minimal amount of time. Each CPU performs a single well defined task on its assigned partition. For example, this type of solution is often used to speed up the net parasitic extraction process. This type of approach often requires that each CPU has to extract its set of net in the net parasitic extraction process.

The second approach also partitions the problem of interest, but the second approach distributes and populates the tasks onto a full database, where each slave works on a part of the database. This second approach is often used to perform some multi-mode multi-corner timing analyses. In a typical multi-mode multi-corner timing analysis, each mode/corner analysis may be performed on a single slave. Nonetheless, the drawback of the first approach for the optimization process is that it may be difficult to find balanced partition to be optimized independently in parallel. For the second approach, the main issue is the memory cost or the memory penalty, which may refer to the amount of memory required for each slave when the slave boots up or is initialized. Sometime, the second approach requires each slave to load the entire design into memory at the time each slave is initialized or boots up. With this second approach, it may not be economical or practical to run large designs on multi-core machines due to such memory cost or memory penalty.

Referring to FIG. 1 which illustrates an exemplary circuit design with a number of paths. Note that FIG. 1 is used solely for the purpose of illustration and ease of explanation and does not intend to limit the scope of any embodiments. It may be assume that there exist two critical paths in this design. In FIG. 1, the items such as I1, I2, . . . , I4, A, and B denote inputs. The items O1, O2, . . . , O4, and Y denote outputs. The items i1, i2, . . . , and i10 denote instances. The lines joining the instances, inputs, and outputs denote timing paths. The first critical path, P1, constitutes I1⇒ i1⇒ i3⇒ i4⇒ O1, and the second critical path, P2, constitutes I3⇒ i6⇒ i8⇒ i9⇒ O3. These two paths may be optimized in parallel. It shall be noted that in this example as shown in FIG. 1, the two critical paths P1 and P2 do not share any logic. Many optimization tools only work on one path at a time regardless of the number of cores an optimization tool may have. In some cases, this limitation of working on one path at a time is due to the non-thread safe characteristic of the optimization tools.

In cases where there exists a third critical path P3 which constitutes I2⇒ i2 ⇒ i3⇒ i5⇒ O2 where critical path P1 and critical path P3 share some logic, e.g., instance i2. In cases where there are two central processing units (CPUs) available, an optimization tool may assign paths P1 and P3 to the first CUP and a path P2 to the second core. In this example, it may be seen that the number of instances for each CPU may be unbalanced. That is, it may be seen that the assignment of P1 and P3 involves five instances to optimize, whereas the assignment of path P2 only involves three instances. Assuming each instance takes about the same amount of processing, it may be seen that the second CPU may complete its assigned tasks earlier than the first CPU due to the fewer number of instances assigned to the second CPU.

On the other hand, in some cases, optimizing the critical paths P1 and P3 on the first CPU may require less CPU resources than optimizing the single critical path P2 on the second CPU so the first CPU completes its assigned optimization tasks earlier and waits for the optimization on the second CPU to complete. In these cases, there still exist some unbalanced use of the computational resources so even though it may take less time in these case to optimize the three critical paths with two CPUs than it would take to optimize the same critical paths with a single CPU by assigning one critical path to the CPU at a time, the processing is nonetheless not optimized due to the existence of unbalanced loads on the CPUs. That is, this approach may be "improved" but not "optimized".

In addition, there exist some cases where, for example, all three critical paths, P1, P2, and P3, all share some logic so the methodology described here assigns all three paths to one CPU due to the shared logic. The unbalanced workload then obviates the advantage of the multiple CPUs and uses only one CPU because all critical timing paths are assigned to the same CPU. It may be seen that for a more complex circuitry the unbalanced distribution of workload may be quite severe and that it may be difficult to predict how to assign paths to or how to partition the circuit or the full path for each CPU so as to achieve optimization.

Therefore, there exists a need for a method, system, and computer program product for parallelizing tasks in processing an electronic circuit design.

SUMMARY

Disclosed are various embodiments of methods, systems, and computer program products for parallelizing tasks in processing an electronic circuit design.

One advantage of some embodiments of the invention to utilize one thread on a part of the electronic design where the part of the electronic design is independent of another part of the electronic design. It is another advantage of some embodiments that the part of the electronic design may constitute an instance or a set of interconnected instances or a full timing path. It is yet another advantage of some embodiments that the partition granularity may be dynamically adapted and managed. It is yet another advantage that the memory overhead to set up threads remains small compared to the memory size consumed by the process or for loading the entire design.

In various embodiments, the method or the system for parallelizing tasks in processing an electronic circuit design employs a master-slave approach. In some embodiments, the method or the system for parallelizing tasks in processing an electronic circuit design loads the full design database information on the master. In some embodiments, at least one of the slaves comprises a stateless node. In some embodiments, the node may comprise a server, a node in a distributed computing environment, a CPU in a multi-processor architecture, a core of a multi-core architecture, or a thread of execution.

In some embodiments, the method or the system supports the time-sliced threading as well as multiprocessor threading with a process scheduler. In some embodiments, the method or the system for parallelizing tasks in processing an electronic circuit design manipulate threads via a system call interface via the operating system. In some embodiments, a stateless node comprises a node that treats each request as an independent transaction that is unrelated to previous request. In various embodiments, the master distributes the tasks to optimize in parallel, and the slave executes the assigned tasks and sends the execution results back to the master. The master then incorporates and persists the execution results in one or more databases.

In embodiments, the method or the system for parallelizing tasks in processing an electronic circuit design comprises loading a full design on a master session. In some embodiments, the method or the system then spawns a plurality of slave sessions. In some embodiments, at least one of the plurality of slave sessions loads a stateless representation of the design. In some embodiments, the method or the system for parallelizing tasks in processing an electronic circuit design sends to at least one slave a nutshell representation of the electronic circuit design. In some embodiments, the nutshell representation of the electronic circuit design comprises a description of a density track grid.

In some embodiments, the nutshell representation of the electronic circuit design comprises an update of the density track grid. In various embodiments, the method or the system for parallelizing tasks in processing an electronic circuit design then identifies a subset of tasks to perform in parallel and sends the subset of tasks to be performed in parallel. In some embodiments, the method or the system for parallelizing tasks in processing an electronic circuit design receives execution results or processing results from some of the plurality of slaves and updates one or more databases to incorporate the execution or processing results.

In some embodiments, the method or the system for parallelizing tasks in processing an electronic circuit design applies to an EDA tool or EDA application that has no natural partition. In some embodiments, the method or the system for parallelizing tasks in processing an electronic circuit design applies to an EDA tool or EDA application whose infrastructure(s) is (are) not thread safe. In various embodiments, the method or the system for parallelizing tasks in processing an electronic circuit design allows speeding up the applications without major rewrite without a need for design partition, and without memory penalty.

In various embodiments, the method comprises initializing a master and a plurality of slaves; identifying or determining a nutshell representation of at least a portion of the electronic circuit design; identifying a task to be processed; causing the task to be processed at least one of the plurality of slaves based at least in part upon the nutshell representation; and displaying a result of processing the task at the at least one of the plurality of slaves or storing the result in a tangible computer readable medium. In some embodiments, the method comprises receiving or replicating a nutshell representation of at least a portion of the electronic circuit design; building a sub-netlist for the at least a portion of the electronic circuit design; building a route of the net; performing a task in parallel with one or more slaves using the route of the net; and displaying a result for the act of performing the task in parallel with one or more slaves or causing to store the result in a tangible computer readable medium.

BRIEF DESCRIPTION OF THE FIGURES

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
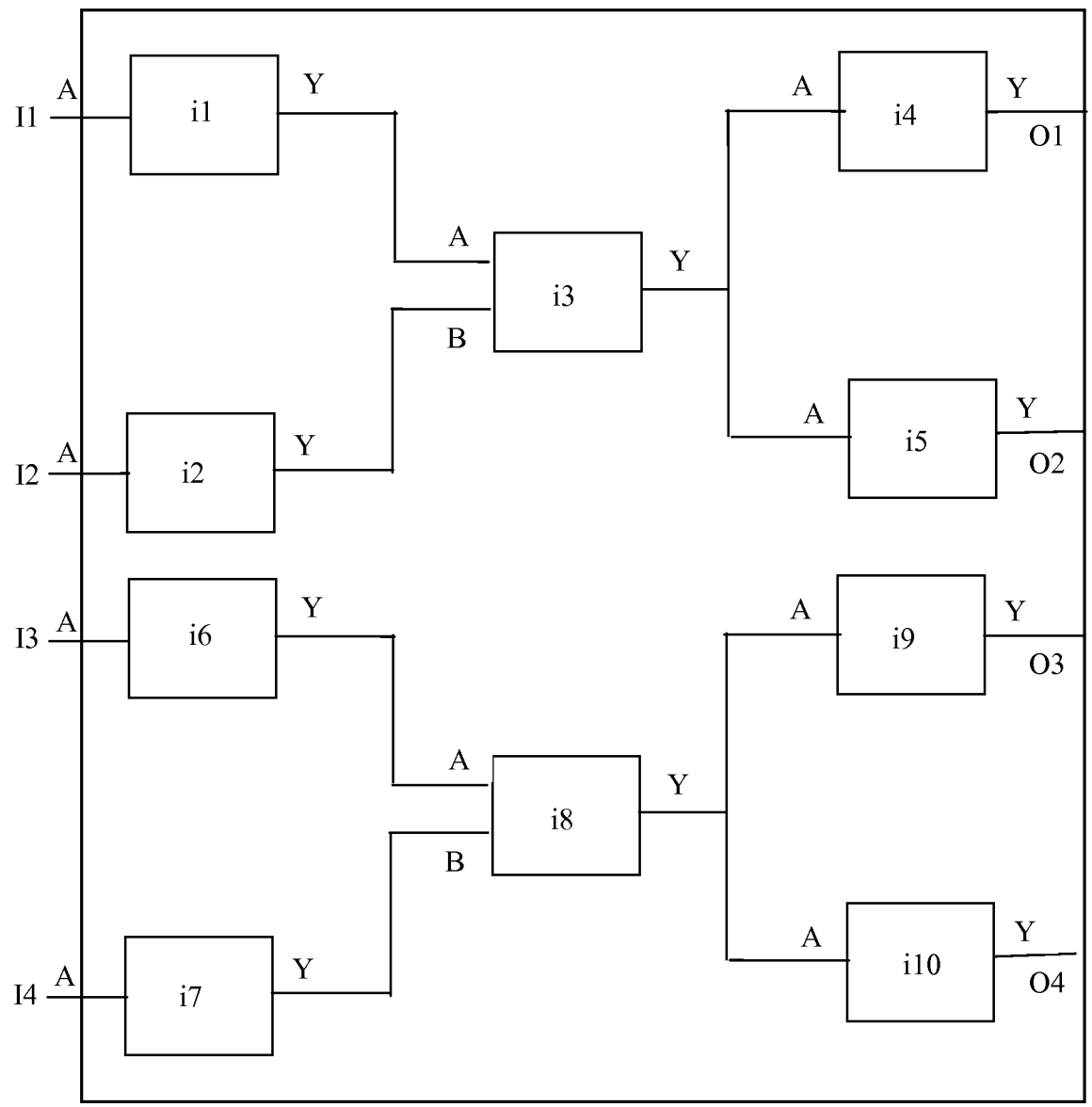
FIG. 1 illustrates an exemplary circuit design with a number of timing paths.

Various embodiments of the invention which are directed to an improved method, system, and computer program product for parallelizing tasks in processing an electronic circuit design. In various embodiments, the term "the method or the system" is used throughout this application and refers to one or more processes or acts of the method for parallelizing tasks or one or more modules of the system for parallelizing tasks.

In various embodiments, the method or the system for parallelizing tasks in processing an electronic circuit design employs a master-slave approach. In various embodiments, the method or the system for parallelizing tasks in processing an electronic circuit design applies in a non-thread safe architecture which does not require the processes or modules to be thread safe. More particularly, the method or the system for parallelizing tasks in processing an electronic circuit design loads the full design database information on a master in some embodiments and initializes a plurality of light weight polyvalent slave nodes (LWPS) or spawns a plurality of sessions for a plurality of light weight polyvalent slave nodes for processing tasks for processing the electronic circuit design in parallel. In some embodiments, an LWPS or a session of an LWPS is similar to a thread in the sense that both the LWPS and the thread only requires a small amount of memory overhead to be initialized or booted up.

In various embodiments, the node may comprise a server, a node in a distributed computing environment, a CPU in a multi-processor architecture, a core of a multi-core architecture, or a thread of execution. In some embodiments, the method or the system for parallelizing tasks in processing an electronic circuit design builds a nutshell representation or an RCGrid (collectively a nutshell representation) which comprises a density track grid or the congestion grid in some embodiments and causes identical or a relevant portion of the RCGrid to be replicated at one or more light weight polyvalent slave nodes. The method or the system then builds a sub-netlist at one or more of the LWPS nodes in some embodiments.

In some embodiments, the method or the system for parallelizing tasks in processing an electronic circuit design identifies one or more tasks for parallel processing at the plurality of slave nodes. In some embodiments, a sub-netlist comprises a piece of the complete design netlist which is to be processed or optimized by a slave. In some embodiments, a task comprises a set of one or more operations to be processed or executed on the sub-netlist constrained by the timing context of the sub-netlist. In some embodiments, the timing context of a sub-netlist comprises the timing boundary conditions or constraints of the sub-netlist.

In some embodiments, the density track grid ensures that a slave has an abstracted understanding of the placement resources available. In some embodiments, the congestion grid ensures that an accurate timing estimation because the pessimism, such as under estimation of the timing estimates, added to the RC value of a given net is a function of the routing congestion when the design is not routed in these embodiments. In some embodiments, the density track grid and the congestion grid ensure that the accuracy of the processing or execution of the tasks by the one or more slaves is as good as or substantially similar to the processing or execution of the tasks by the master which has the knowledge of the entire electronic circuit design. In some embodiments, each of the one or more slaves may be assimilated to a thread regardless of whether or not the EDA tool is thread safe.

In some embodiments, the method or the system for parallelizing tasks in processing an electronic circuit design then causes the LWPS nodes which receive tasks to process the tasks received in parallel. The method or the system for parallelizing tasks in processing an electronic circuit design then receives execution or processing results from the plurality of slave nodes in some embodiments and updates one or more databases to incorporate the executing or processing results in some embodiments. In some embodiments, the method or the system for parallelizing tasks in processing an electronic circuit design then determine whether or not there exist more tasks to be processed in parallel and iteratively loops back to appropriate processes or sub-systems to causes these more tasks to be processed in parallel.

In some embodiments, the method or the system for parallelizing tasks in processing an electronic circuit design allows a user to specify one or more parameters. In some embodiments, the one or more parameters comprise a number of slaves, slave sessions, or sessions of LWPSs to spawn. In some embodiments, the one or more parameters comprise a type of tasks to perform in parallel. In some embodiments, the type of tasks to perform comprises resizing, restructuring, or buffering. In some embodiments, the one or more parameters comprise a size of the sub-netlist to optimize in parallel. In some embodiments, the master is responsible for an extraction process.

In some embodiments, the master performs a levelized optimization or levelized processing where a plurality of instances on the same timing level may be optimized in parallel. In some embodiments, the method or the system 200 for parallelizing tasks in processing an electronic circuit design builds or causes to build a small task for each instance on the same level. For example, in some embodiments where the method or the system 200 for parallelizing tasks in processing an electronic circuit design spawns three slaves to process the electronic circuit design as shown in FIG. 1, the master may optimize i1, i2, and i6 in parallel. If the resize of the instance i6 fixes the timing violation on P2, the master may refocus or re-allocate its resources on the remaining critical paths P1 and P3 in some embodiments.

Figure 2:
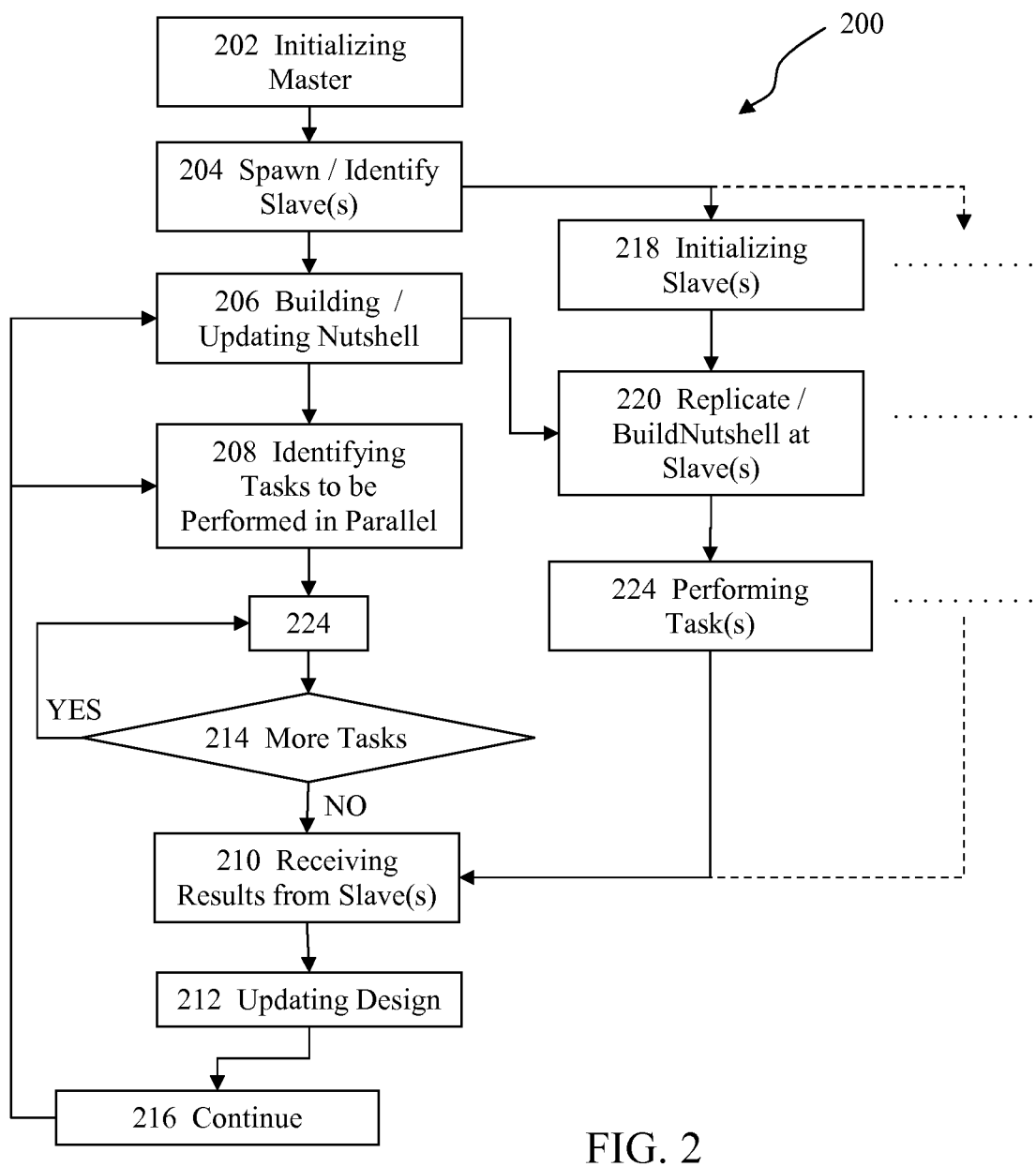
FIG. 2 illustrates a high level block diagram for the method or the system for parallelizing tasks in processing an electronic circuit design.

Referring to FIG. 2 which a high level block diagram for the method or the system 200 for parallelizing tasks in processing an electronic circuit design. At 202, the method or the system for parallelizing tasks in processing an electronic circuit design is configured for initializing a master session in some embodiments. In some embodiments, the method or the system for parallelizing tasks in processing an electronic circuit design is further configured for loading a full design at the master session.

At 204, the method or the system for parallelizing tasks in processing an electronic circuit design spawns or identifies one or more slave sessions, LWPSs, or one or more LWPS sessions (collectively slaves). In various embodiments, the master session, the sessions for the LWPS, or the slave session refers to a session during which the processes of processing the electronic circuit design occurs. In some embodiments, these sessions also refer to a communication session in which interactive information exchange between the slaves or between the master and the slaves occurs. In some embodiments, a slave session comprises a light weight polyvalent slave (LWPS) which loads or builds a nutshell representation of the electronic circuit design rather than the full design. More information about initializing or spawning one or more slaves will be described in details in subsequent sections related to, for example, the processes or modules at 218.

In various embodiments, the method or the system for parallelizing tasks in processing an electronic circuit design determines or identifies a nutshell representation or nutshell design and causes a slave or a LWPS to load the nutshell representation or nutshell design such that the slave's processing the nutshell representation achieves identical or substantially similar effects as the master's processing the entire electronic circuit design or a representation thereof. One of ordinary skills in the art will clearly understand that the identical or substantially similar effects comprise results of the slave's processing or executing various tasks which are identical to the results of the master's processing or executing similar tasks while having knowledge of the entire electronic circuit design or results of the slave's processing or executing various tasks which are sufficiently close to the results of the master's processing or executing various tasks with a view of the entire design for the intended purposes for processing the electronic circuit design.

In some embodiments, the method or the system for parallelizing tasks in processing an electronic circuit design determines or identifies the nutshell representation or nutshell design such that the slave processes the nutshell representation as if the master were processing the portion of the entire electronic circuit design. In various embodiments, the nutshell design or representation is configured for enabling a slave, a slave session, an LWPS, or an LWPS session (collectively slave) to perform the one or more assigned tasks locally with the same or substantially similar accuracy as the master without giving full context to the slave. In this manner, the method or the system for parallelizing tasks in processing an electronic circuit design reduces the memory footprint of the slave significantly.

In various embodiments, a nutshell representation of the electronic circuit design or a nutshell design comprises an abstracted representation of the complete or electronic circuit design or a portion thereof which stores a minimal set of information for a slave node, a slave session, or a LWPS to perform the tasks of interest for the current session. Therefore, a nutshell design or nutshell representation for tasks in timing optimizing may be different from that for tasks in design closure because a slave session or a slave node may require a different set of information in processing tasks for each. In some embodiments, the method or the system for parallelizing tasks in processing an electronic circuit design employs the abstracted representation of the complete or electronic circuit design or a portion thereof to cause a slave to perform the one or more tasks as the master session does on the entire electronic circuit design.

In some embodiments, a nutshell design or a nutshell representation may exclude a logical database and some or all of the timing constraints so long as the nutshell design or representation comprises sufficient information for a slave to execute the assigned task on a sub-netlist as the master does without getting the full context of the electronic circuit design at the slave. In some embodiments, all of the plurality of slaves spawned by the method or the system for processing tasks in parallel receive identical nutshell design or representation. In some embodiments, one or more of the plurality of slaves spawned by the method or the system for processing tasks in parallel receive a different nutshell representation than one or more other slaves.

In some embodiments, each slave receives a different nutshell design or nutshell representation. In some embodiments, the method or the system for parallelizing tasks in processing an electronic circuit design determines whether or not a slave node or a slave session receives an identical nutshell design or nutshell representation based at least in part upon whether or not the one or more tasks to be processed in parallel at the slave are independent of other portion of the electronic circuit design or can be processed within an independent portion of the electronic circuit design without affecting or being affected by other portion of the electronic circuit design. In these embodiments where the method or the system determines that the one or more tasks to be processed by a slave may be processed entirely within an independent portion of the electronic circuit design without affecting or being affected by other portion of the electronic circuit design, the method or the system causes the slave to receive a nutshell design or a nutshell representation representative of the independent portion of the electronic circuit design.

In some embodiments, the method or the system for parallelizing tasks in processing an electronic circuit design identifies or determines a plurality of independent nutshell representations. In these embodiments, the method or the system for parallelizing tasks in processing an electronic circuit design causes a slave to receive a nutshell design or nutshell representation which comprises one or more of the plurality of independent nutshell representations based upon the one or more tasks to be processed at the slave. That is, the method or the system determines whether or not the processing of the one or more tasks at the slave may affect or may be affected by other portions of the electronic circuit design in these embodiments. Where the method or the system determines that the processing of the one or more tasks at the slave may affect or may be affected by other portions of the electronic circuit design, the method or the system causes the slave to receive one or more of the independent nutshell representations which encompass all the portions which may affect or may be affected by the processing of the one or more tasks at the slave in some embodiments.

In various embodiments, a nutshell representation or a nutshell design, whether independent or not, comprises physical information of at least a portion of the electronic circuit design. In some embodiments, the physical information comprises the floorplan description for the at least a portion of the electronic circuit design. In some embodiments, the physical information comprises the description for the tracks and rows of the at least a portion of the electronic circuit design. In some embodiments, the physical information comprises information about blockages of the at least a portion of the electronic circuit design.

In some embodiments, a nutshell representation or a nutshell design further comprises one or more libraries of the at least a portion of the electronic circuit design. In some embodiments, the one or more libraries comprise a timing library. In some embodiments, a nutshell design or a nutshell representation comprises the description for the views and corners for the multi-mode multi-corner (MMMC) mode. In some embodiments, a nutshell representation or a nutshell design comprises a density track for the at least a portion of the electronic circuit design. In some embodiments, a nutshell representation or design comprises one or more congestion grids for the least a portion of the electronic circuit design. More details about the density track and the congestion grid will be described in the following paragraphs.

At 206, the method or the system for parallelizing tasks in processing an electronic circuit design builds, identifies, receives, determines, or updates one or more RCGrids or nutshell representations in some embodiments. In some embodiments, an RCGrid comprises a density track which stores a capacitance or a resistance value for a given location in the electronic circuit design. In some embodiments, an EDA tool relies on the value to extract the net parasitic. In some embodiments, an RCGrid comprises a congestion grid which reports the placement congestion information for a given location in the electronic circuit design.

At 208, the method or the system for parallelizing tasks in processing an electronic circuit design identifies one or more tasks to be processed. In some embodiments, the method or the system identifies the one or more tasks as a set of interconnected gates each of which represents one or more pieces of the entire electronic circuit design to perform advanced and complex operations. In some embodiments, the advanced and complex operations comprise, for example but not limited to, database manipulations, delay calculations, timing propagations, or optimizations. In some embodiments, the method or the system sends the one or more tasks to some or all of the one or more slave sessions or LWPSs to be processed or executed in parallel at 224. {Need a transition here; "the order of execution is not important"}

At 218, the method or the system for parallelizing tasks in processing an electronic circuit design causes the initialization of the one or more slaves or light weight polyvalent slave sessions in some embodiments. In some embodiments, the method or the system for parallelizing tasks in processing an electronic circuit design causes an initialized slave to load a nutshell representation of at least a portion of the electronic circuit design.

In some embodiments, all of the plurality of slaves spawned by the method or the system for processing tasks in parallel receive identical nutshell design or representation. In these embodiments, all of the plurality of slaves have the same abstracted representation of the electronic circuit design.

One situation where all of the plurality of slaves receive the same nutshell representation or design is where a portion of the electronic circuit design is interrelated, affects, or is affected by all the other portions or a substantial part of the remaining portion of the electronic circuit design in such a way that it would be desirable or necessary for each slave responsible for processing the portion of the electronic circuit design to have a knowledge of the other portions of the electronic circuit design. Another situation where all of the plurality of slaves receive the same nutshell representation or design more or less share some logic so it would be desirable or necessary for all slaves to have the same nutshell representation or design which comprises the abstracted representation of the complete electronic circuit design. Another situation where all of the plurality of slaves receive the same nutshell representation or design is where partitioning the electronic circuit design into natural partitions may be challenging.

In some embodiments, one or more of the plurality of slaves spawned by the method or the system for processing tasks in parallel receive a different nutshell representation than one or more other slaves. For example, the method or system may determine that a particular portion of the electronic circuit design is sufficiently independent of the remaining portion of the electronic circuit design. In this example, the slave responsible for processing or executing the tasks related to the particular portion of the electronic circuit design receives a nutshell representation of the particular portion and need no knowledge of the remaining portion of the electronic circuit design. The method or the system in these embodiments may be applied to cases comprising the situations where the particular portion of the electronic circuit design shares no logic with the remaining portions of the design, or when processing the particular portion by the responsible slave does not affect and is not affected by processing the remaining portions of the electronic circuit design by other slaves. The method or the system in these embodiments may also be applied to cases comprising the situations where the portion of the electronic circuit design is sufficiently independent of the remaining portion of the electronic circuit. It shall be noted that one of ordinary skills in the art would clearly understand that other situations where some slaves have different nutshell designs than other slaves are also possible.

In some embodiments, each slave receives a different nutshell design or nutshell representation. The method or the system in these embodiments may be applied to cases comprising the situations where the electronic circuit design is partitioned into some natural partitions each of which is substantially independent of or does not affect or is not affected by the other partitions. The method or the system in these embodiments may also be applied to cases comprising the situations where the electronic circuit design is partitioned into a plurality of natural partitions where each of the partition is not sharing some logic with the other partitions. As a result, the one or more slaves responsible for processing the tasks arising from one of the partitions need no knowledge of the remaining partitions and may thus receive a nutshell representation of the particular partition or portion of the electronic circuit design.

In various embodiments, a partition may be called a natural partition where the partition is substantially independent of the other partitions in the sense that the partition may be constructed substantially independently of the other partitions. In various embodiments, a particular partition may be called a non-ambiguous partition where the particular partition does not interact with one or more other partitions in the sense that the processing of the tasks arising out of the particular partition does not affect and is not affected by the processing of the tasks arising out of one or more other partitions.

In some embodiments, the method or the system for parallelizing tasks in processing an electronic circuit design determines whether or not a slave node or a slave session receives an identical nutshell design or nutshell representation based at least in part upon whether or not the one or more tasks to be processed in parallel at the slave are independent of other portion of the electronic circuit design or can be processed within an independent portion of the electronic circuit design without affecting or being affected by other portion of the electronic circuit design. In these embodiments where the method or the system determines that the one or more tasks to be processed by a slave may be processed entirely within an independent portion of the electronic circuit design without affecting or being affected by other portion of the electronic circuit design, the method or the system causes the slave to receive a nutshell design or a nutshell representation representative of the independent portion of the electronic circuit design.

In some embodiments, the method or the system for parallelizing tasks in processing an electronic circuit design identifies or determines a plurality of independent nutshell representations. In these embodiments, the method or the system for parallelizing tasks in processing an electronic circuit design causes a slave to receive a nutshell design or nutshell representation which comprises one or more of the plurality of independent nutshell representations based upon the one or more tasks to be processed at the slave. That is, the method or the system determines whether or not the processing of the one or more tasks at the slave may affect or may be affected by other portions of the electronic circuit design in these embodiments. Where the method or the system determines that the processing of the one or more tasks at the slave may affect or may be affected by other portions of the electronic circuit design, the method or the system causes the slave to receive one or more of the independent nutshell representations which encompass all the portions which may affect or may be affected by the processing of the one or more tasks at the slave in some embodiments.

At 220, the method or the system for parallelizing tasks in processing an electronic circuit design causes a respective RCGrid or a respective nutshell representation (collectively a nutshell representation) to be replicated at each of the one or more slaves or light weight polyvalent slave sessions in some embodiments. In some embodiments, an identical respective RCGrid is replicated at each of the one or more slaves or LWPSs. In some embodiments, one RCGrid is replicated on a slave or LWPS while one or more different RCGrids are replicated on other slaves or LWPSs. In some embodiments, the method or the system for parallelizing tasks in processing an electronic circuit design determines whether or not to cause an identical RCGrid to be replicated at the one or more slaves or LWPSs based at least in part upon whether or not the one or more slaves or LWPSs receive an identical nutshell representation or different nutshell representations.

At 224, the method or the system for parallelizing tasks in processing an electronic circuit design causes at least some of the slaves or LWPSs to process or execute, in parallel, one or more of the tasks identified at 208. In some embodiments, one of the at least some of the slaves or LWPSs generate a result of the processing or executing the one or more tasks. In some embodiments, the method or the system for parallelizing tasks in processing an electronic circuit design builds the sub-netlist in at least one of the one or more slaves or LWPSs in some embodiments. In some embodiments, the method or the system for parallelizing tasks in processing an electronic circuit design builds a respective sub-netlist for each of the one or more slaves or LWPSs. In some embodiments, the method or the system for parallelizing tasks in processing an electronic circuit design builds one or more nets for the sub-netlist. In some embodiments, the method or the system for parallelizing tasks in processing an electronic circuit design builds one or more routes for a net.

At 214, the method or the system for parallelizing tasks in processing an electronic circuit design determines whether or not there exist more tasks to be processed in some embodiments. In some embodiments where the method or the system for parallelizing tasks in processing an electronic circuit design determines that there exist no more tasks to be processed, the method or the system proceeds to 210 to receive one or more results of processing or executing one or more tasks in parallel at the plurality of slaves.

In some embodiments where the method or the system for parallelizing tasks in processing an electronic circuit design determines that there exist more tasks to be processed, the method or the system loops back to 224 and repeats the processes or actions as described above.

In some embodiments where the method or the system for parallelizing tasks in processing an electronic circuit design determines that there exist more tasks to process or execute in parallel, the method or the system determines whether or not it is necessary or desirable to spawn a new slave or a new LWPS. If so, the method or the system proceeds to 204 and then 218 to spawn the new slave or LWPS and to cause the newly spawned slave or LWPS to initialize. In some embodiments where the method or the system for parallelizing tasks in processing an electronic circuit design determines that there exist more tasks to process or execute in parallel, the method or system determines that whether it is desirable or necessary to rebuild the RCGrid while utilizing one or more existing slaves or LWPSs for processing these tasks. If so, the method or the system proceeds to 206 to build the nutshell representation. The latter may comprise the situation where the design has been modified after the updating action or process at 212.

In various embodiments, the method or the system for parallelizing tasks in processing an electronic circuit design allows speeding up the applications without major rewrite without a need for design partition, and without memory penalty. In some embodiments, the method or the system for parallelizing tasks in processing an electronic circuit design require no rewrite or modification of the transform process or sub-system, the timing engine, and the database code. In some embodiments, the method or the system for parallelizing tasks in processing an electronic circuit design only requires rewriting or modifying the top driver which is a software component which is used to interact with some hardware devices.

In some embodiments, the method or the system for parallelizing tasks in processing an electronic circuit design dynamically manages the granularity of the one or more sub-netlists to work on. In some embodiments, the method or the system for parallelizing tasks in processing an electronic circuit design causes the master to dynamically manage the granularity of the one or more sub-netlists to work on. In some embodiments, the master may determine to perform a resize on a single instance. In some embodiments, the master may describe an entire module on which an optimization may be executed.

In some embodiments, the method or the system for parallelizing tasks in processing an electronic circuit design may be executed on a multi-CPU system such as a Linux Storage Filesystem (LSF). In some embodiments, the method or the system for parallelizing tasks in processing an electronic circuit design may be executed on a multi-core system on which a plurality of slaves may be booted. In these embodiments, the use of a nutshell representation or nutshell design by the method or the system produces an advantage in memory consumption.

For example, a typical full chip implementation EDA tool session may consumes about 250 megabytes of memory when the full chip implementation session loads a nutshell representation in some cases. Nonetheless, if the master sends one or more sub-netlists of 100 instances to a slave, the increase for the slave's memory consumption is no more than a few megabytes. In this example, when a typical full chip implementation session may load an electronic circuit design of about 20 gigabytes. The same design may be loaded in an 8-core system with overall memory consumption of about 22 gigabytes, or 20 Gigabytes plus seven times 250 megabytes. As a result, the 8-core system may be set up as one master and seven slaves, and this setup will speed up the processing of the electronic circuit design dramatically with the method or the system for parallelizing tasks in processing an electronic circuit design described herein.

In some embodiments, the method or the system for parallelizing tasks in processing an electronic circuit design reduces the processing time according to the formula of $(T_{master}+T_{SetupSlave})/N$, where N denotes the number of slaves, $T_{master}$ denotes the processing time of the tasks by the master, and $T_{setup\ Slave}$ denotes the time required to setup the N slaves. In various embodiments, it has been demonstrated that $T_{Setup\ Slave}$ is no more than 50% of $T_{master}$. Therefore, it may be seen that with three slaves, the processing time is no more than ½ of $T_{master}$ which translates to at least 50% reduction in processing time. With seven slaves, the processing time is no more than 0.215 times $T_{master}$, which translates to at least 78.5% reduction in processing time. On the other hand, conventional approach to parallel processing would require replication of the entire design for each core and thus requires 160 gigabytes of memory consumption.

At 210, the method or the system for parallelizing tasks in processing an electronic circuit design receives the result generated by the at least some of the slaves or LWPSs which process or execute the tasks in parallel in some embodiments.

At 212, the method or the system for parallelizing tasks in processing an electronic circuit design then updates the master result database for the entire electronic circuit design by incorporating the results received from the slaves or LWPSs which process or executed the tasks in parallel in some embodiments. In some embodiments, the master result database may comprise a database, a table, a list, or any other data structure for storage of data. In some embodiments, the method or the system for parallelizing tasks in processing an electronic circuit design may further update the electronic circuit design in response to the results received.

In some embodiments, the method or the system for parallelizing tasks in processing an electronic circuit design proceeds from 212 to 216 to continue with further actions. In some embodiments, the method or the system for parallelizing tasks in processing an electronic circuit design continues from 216 to 206 to update the one or more nutshell representations or nutshell designs. In some embodiments, the method or the system for parallelizing tasks in processing an electronic circuit design continues from 216 to 208 to identify additional tasks to be performed or executed in parallel.

For example, in some embodiments where the parallel processing results indicate a timing violation, the method or the system for parallelizing tasks in processing an electronic circuit design may modify the design by, for example, adjusting the slack or the driver to eliminate the violation. This adjustment will cause the electronic circuit design to change which may render it desirable or necessary to rebuild the RCGrid. In some embodiments, the method or the system for parallelizing tasks in processing an electronic circuit design updates the one or more nutshell representations or nutshell designs. One of ordinary skills in the art would clearly understand that the order in which processes 214, 210, and 212 is executed in the method or the modules 210, 212, and 214 is invoked may not be critical and may be changed without affecting the intended purposes of various embodiments.

Figure 3:
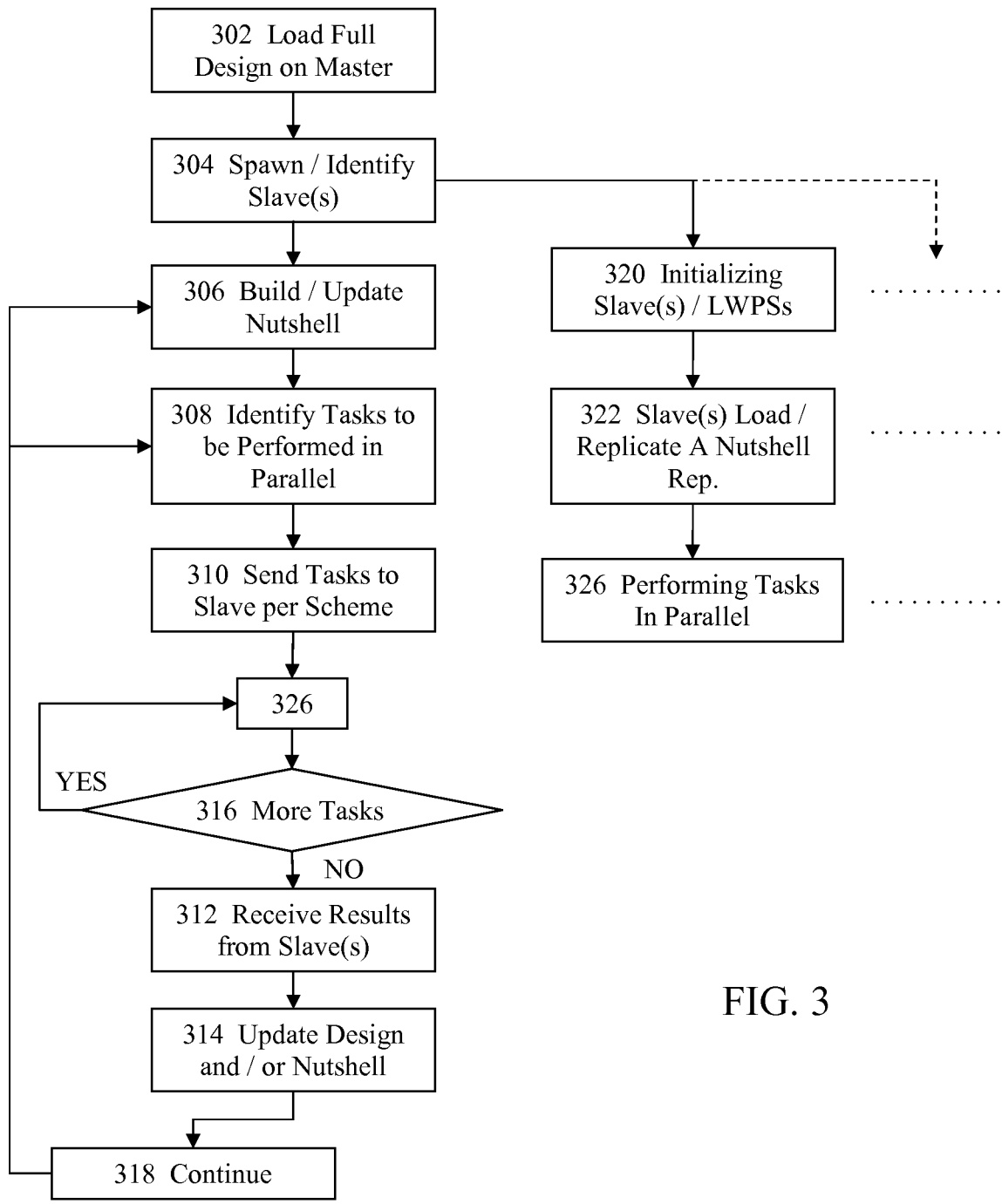
FIG. 3 illustrates more details about the method or the system for parallelizing tasks in processing an electronic circuit design.

Referring to FIG. 3 which illustrates more details about the method or the system for parallelizing tasks in processing an electronic circuit design. At 302, the method or the system for parallelizing tasks in processing an electronic circuit design initializes a master session or a master (collectively master) on an EDA tool in some embodiments. In some embodiments, the method or the system for parallelizing tasks in processing an electronic circuit design loads the full electronic circuit design on the master. One of ordinary skills in the art would clearly understand that the EDA tool comprises one or more processes, codes, programs, objects, instances, tasks, operations, or collections of instructions which may comprise software, hardware, or a combination of software and hardware (collectively EDA tool) running on one or more systems which comprise one or more computer systems. In some embodiments, the method or the system for parallelizing tasks in processing an electronic circuit design is further configured for loading a full design at the master session. At 304, the method or the system for parallelizing tasks in processing an electronic circuit design spawns one or more slave sessions or LWPSs on the EDA tool.

At 306, the method or the system for parallelizing tasks in processing an electronic circuit design builds one or more RCGrids or one or more nutshell representations (collectively nutshell representations) of the electronic circuit design in some embodiments. In some embodiments, the method or the system for parallelizing tasks in processing an electronic circuit design causes the one or more slave sessions or LWPSs to boot up. In some embodiments, the method or the system for parallelizing tasks in processing an electronic circuit design identifies, receives, or determines one or more nutshell representations or nutshell designs or updates the one or more existing nutshell representations or nutshell designs. In some embodiments, the method or the system for parallelizing tasks in processing an electronic circuit design forwards the one or more nutshell representations or designs or the one or more updated nutshell representations or designs to some or all of the one or more slave sessions or LWPSs.

At 308, the method or the system for parallelizing tasks in processing an electronic circuit design identifies one or more tasks to be processed. In some embodiments, the method or the system identifies the one or more tasks as a set of interconnected gates each of which represents one or more pieces of the entire electronic circuit design to perform advanced and complex operations.

At 310, the method or the system for parallelizing tasks in processing an electronic circuit design sends the one or more tasks to some or all of the one or more slave sessions or LWPSs to be processed or executed in parallel based at least in part upon a scheme in some embodiments. In some embodiments, the method or the system for parallelizing tasks in processing an electronic circuit design identifies or determines the scheme to create balanced partitions. In various embodiments, a balanced partition comprises a partition that creates the same or substantially similar workload for each of the some or all slave sessions or LWPSs. One of ordinary skills in the art would clearly understand that a workload at a salve session or LWPS may be deemed substantially similar to that at another slave session or LWPS where the computing resources used at these two slave sessions or LWPSs are about the same or the execution times at these two slave sessions or LWPSs are substantially the same so one slave session or LWPS need not wait for the other slave session or LWPS for an extended period of time to complete processor execution. In some embodiments, the method or the system for parallelizing tasks in processing an electronic circuit design processes or causes to process the one or more tasks at the one or more slaves at 326 after the method or the system sends the one or more tasks to the one or more slaves according to the scheme at 310.

At 320, the method or the system for parallelizing tasks in processing an electronic circuit design causes the one or more slave sessions or LWPSs to be initialized in some embodiments. At 322, the method or the system for parallelizing tasks in processing an electronic circuit design causes some or all of the one or more slave sessions or LWPSs to replicate one or more nutshell representations or designs in some embodiments. In some embodiments, the method or the system for parallelizing tasks in processing an electronic circuit design causes some or all of the one or more slave sessions or LWPSs to load one or more nutshell representations or designs forwarded from the master. In some embodiments, all of the some or all slave sessions or LWPSs load or to replicate the same nutshell representation or nutshell design. In some embodiments, one or more of the some or all slave sessions or LWPSs load or replicate one or more different nutshell representations or nutshell designs than the remaining of the some or all slave sessions or LWPSs. In some embodiments, each of the some or all slave sessions loads or replicates a different nutshell representation or nutshell design.

At 326, the method or the system for parallelizing tasks in processing an electronic circuit design causes the some or all of the slave sessions or LWPSs to perform tasks in parallel in some embodiments. In some embodiments, the method or the system for parallelizing tasks in processing an electronic circuit design causes some or all of the slave sessions or LWPSs to build or receive a sub-netlist for each of the some or all of the slave sessions or LWPSs in some embodiments. In some embodiments, each of the some or all of the slave sessions or LWPSs builds a respective sub-netlist for the portion of the design that each slave session or LWPS is responsible for processing or executing one or more tasks thereof. In some embodiments, some of the slave sessions or LWPSs build or receive the same sub-netlist, while each of the other slave sessions or LWPSs build or receive a different sub-netlist respectively. In some embodiments, all of the slave sessions or LWPSs build or receive the same sub-netlist.

At 316, the method or the system for parallelizing tasks in processing an electronic circuit design determines whether or not there exist more tasks to be processed in some embodiments. In some embodiments where the method or the system for parallelizing tasks in processing an electronic circuit design determines that there exist no more tasks to be processed, the method or the system proceeds to 312. At 312, the method or the system for parallelizing tasks in processing an electronic circuit design receives one or more results from the processing or execution of the one or more tasks in parallel at the some or all slave sessions or LWPSs in some embodiments. At 314, the method or the system for parallelizing tasks in processing an electronic circuit design then updates the electronic circuit design or the master result database for the entire electronic circuit design by incorporating the results received from the slaves or LWPSs which process or executed the tasks in parallel in some embodiments. In some embodiments, the method or the system for parallelizing tasks in processing an electronic circuit design updates the one or more nutshell representations or nutshell designs. At 318, the method or the system for parallelizing tasks in processing an electronic circuit design then proceeds to 318 to continue with further processes for the method or to continue invoking further modules for the system in some embodiments.

In some embodiments, the method or the system for parallelizing tasks in processing an electronic circuit design continues from 318 to 306 to update the one or more nutshell representations or nutshell designs. In some embodiments, the method or the system for parallelizing tasks in processing an electronic circuit design continues form 318 to 308 to identify more tasks to be performed in parallel.

In some embodiments where the method or the system for parallelizing tasks in processing an electronic circuit design determines that there exist more tasks to be processed, the method or the system loops back to 326, 308, or 310 and repeats the processes or actions as described above. In some embodiments where the method or the system for parallelizing tasks in processing an electronic circuit design determines that there exist more tasks to process or execute in parallel, the method or the system proceeds to 308 to identify the more tasks to be performed or executed in parallel. In some embodiments where the method or the system for parallelizing tasks in processing an electronic circuit design determines that there exist more tasks to process or execute in parallel, the method or the system determines whether or not it is necessary or desirable to spawn a new slave or a new LWPS. If so, the method or the system proceeds to 304 and then 320 to spawn the new slave or LWPS and to cause the newly spawned slave or LWPS to initialize.

In some embodiments where the method or the system for parallelizing tasks in processing an electronic circuit design determines that there exist more tasks to process or execute in parallel, the method or system determines that whether it is desirable or necessary to rebuild the RCGrid or the nutshell representation while utilizing one or more existing slaves or LWPSs for processing these tasks. If so, the method or the system proceeds to 306 to build or update the RCGrid or the nutshell representation or design. The latter may comprise the situation where the design has been modified after the updating action or process at 314. In some embodiments where the method or the system for parallelizing tasks in processing an electronic circuit design determines that there exist more tasks to process or execute in parallel, the method or system proceeds back to 308 to identify the more tasks, if not so identified, for further parallel processing. Where the method or the system for parallelizing tasks in processing an electronic circuit design determines that there exist more tasks to process or execute in parallel, the method or system may also directly send the more tasks to one or more slaves for parallel processing, 310.

Figure 4:
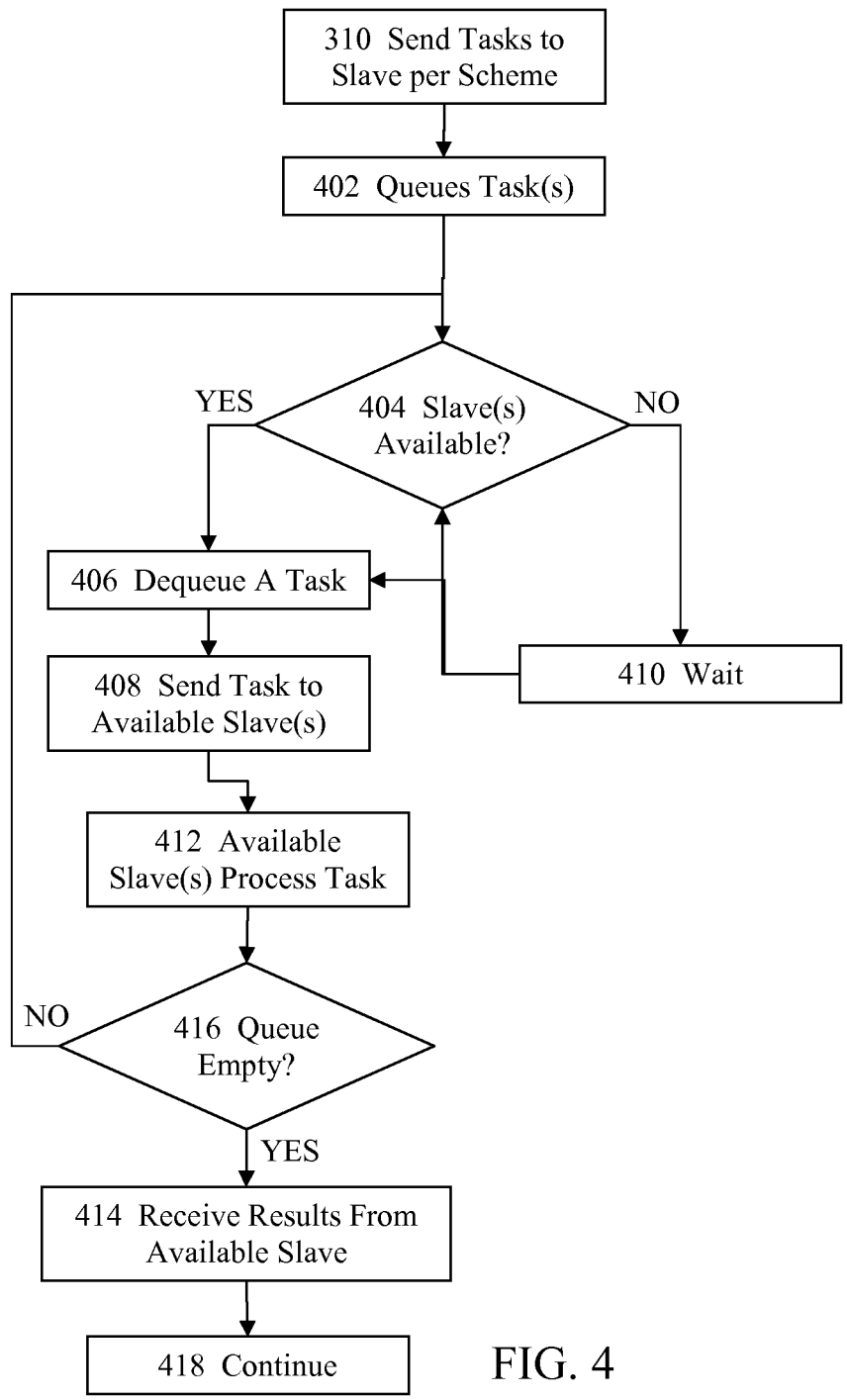
FIG. 4 illustrates more details for distributing the tasks for parallel processing of the method or the system for parallelizing tasks in processing an electronic circuit design.

Referring to FIG. 4 which illustrates more details for distributing the tasks for parallel processing of the method or the system for parallelizing tasks in processing an electronic circuit design. At 310, the method or the system for parallelizing tasks in processing an electronic circuit design sends the one or more tasks to some or all of the slave sessions or LWPSs based at least in part upon a scheme in some embodiments. In some embodiments, the method or the system for parallelizing tasks in processing an electronic circuit design causes one or more tasks to be processed or executed at the slave session or LWPS to be queued at 402.

In some embodiments, the method or the system for parallelizing tasks in processing an electronic circuit design determines, at 404, whether there exists at least one slave available for processing one or more tasks identified previously. In some embodiments, the one or more tasks may be queued according to a FIFO (first in, first out) abstraction in ways of organizing and manipulating the one or more tasks. In some embodiments, the one or more tasks may be queued according to a LIFO (last in, first out) abstraction in ways of organizing and manipulating the one or more tasks. In some embodiments, the one or more tasks may be queued according to a predetermined abstraction in ways of organizing and manipulating the one or more tasks which may assign one or more priorities to the one or more tasks based on a goal, a requirement, a constraint, an intended purpose, a user input, or other criteria.

In some embodiments where the method or the system for parallelizing tasks in processing an electronic circuit design determines that there exists at least one slave session or LWPS to process the one or more tasks identified, the method or the system then causes a task which is previously queued to be dequeued from the queue at 406. In some embodiments, the method or the system for parallelizing tasks in processing an electronic circuit design sends the dequeued task to the one or more available slave sessions or LWPSs to be processed at 408. In some embodiments, the method or the system for parallelizing tasks in processing an electronic circuit design then causes some or all of the available slave sessions or LWPSs to process the dequeued tasks in parallel at 412. In some embodiments, the method or the system for parallelizing tasks in processing an electronic circuit design receives one or more results of the processing or executing of the one or more dequeued tasks at the some or all of the available slave sessions or LWPSs at 414. In some embodiments, the method or the system for parallelizing tasks in processing an electronic circuit design proceeds from 412 directly to 416 to determine whether the queue is empty and then proceeds to 414 to receive one or more results from the one or more available slave(s). That is, the order of the actions 414 and 416 may be changed.

In some embodiments, the method or the system for parallelizing tasks in processing an electronic circuit design determines whether the queue is empty or whether or not there exists at least one task to be processed at 416. In some embodiments where the method or the system for parallelizing tasks in processing an electronic circuit design determines that the queue is empty or there exists no task to be processed, the method or the system proceeds to 418 to continue with further actions. In some embodiments where the method or the system for parallelizing tasks in processing an electronic circuit design determines that there exists at least one task to be processed or the queue is not empty, the method or the system goes back to 404 to repeat the actions as described above.

In some embodiments where the method or the system for parallelizing tasks in processing an electronic circuit design determines that there exists no available slave session or LWPS to process the one or more tasks identified, the method or the system then proceeds to 410 to wait for at least one slave session or LWPS to become available. In some embodiments, the method or the system for parallelizing tasks in processing an electronic circuit design repeatedly performs the action or process or repeated invokes the sub-system at 404 to determine whether at least one slave session or LWPS is available. In some embodiments, the method or the system for parallelizing tasks in processing an electronic circuit design proceeds to 406 once the method or the system determines that at least one slave session or LWPS has become available.

Figure 5:
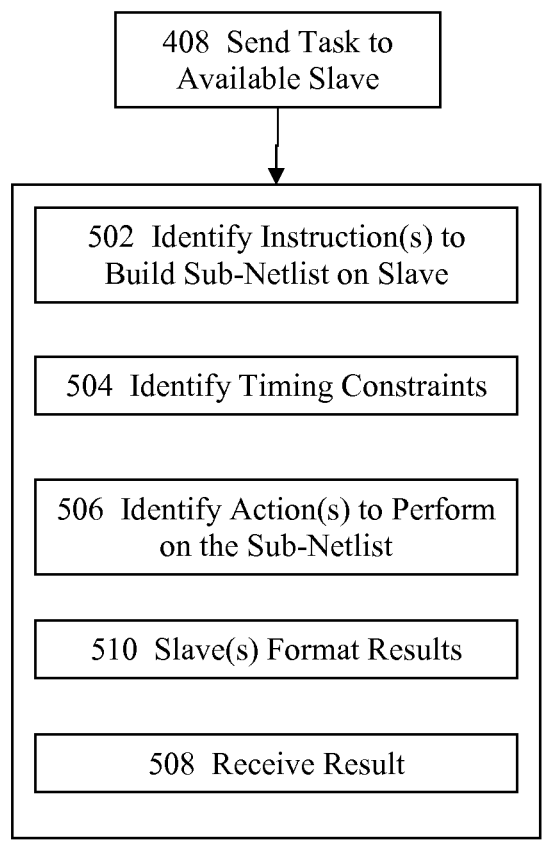
FIG. 5 illustrates more details for the process or the subsystem for sending tasks to one or more slaves for processing of the method or the system for parallelizing tasks in processing an electronic circuit design.

Referring to FIG. 5 which illustrates more details for the process or the sub-system for sending tasks to one or more slaves for processing of the method or the system for parallelizing tasks in processing an electronic circuit design. At 408, the method or the system for parallelizing tasks in processing an electronic circuit design sends one or more tasks previously identified to some or all of the available slave sessions or LWPSs in some embodiments. In various embodiments, when the method or the system for parallelizing tasks in processing an electronic circuit design sends a task to a slave session or an LWPS, the method or the system also sends addition information or data which comprise 502, 504, or 506 to the slave session or LWPS.

At 502, the method or the system for parallelizing tasks in processing an electronic circuit design identifies one or more instructions to build or to receive one or more sub-netlists at some or all of the available slave sessions or LWPSs in some embodiments. At 504, the method or the system for parallelizing tasks in processing an electronic circuit design identifies or receives one or more timing constraints in some embodiments. In some embodiments, the one or more timing constraints may be imposed or set on a boundary of the sub-netlist. At 510, the method or the system for parallelizing tasks in processing an electronic circuit design arrange, organize, format, or filter or causes to arrange, organize, format, or filter the results of processing the one or more tasks at the one or more slaves in some embodiments based upon requirement by the master or by the designer. In some embodiments, the method or the system arranges, organizes, formats, or filters or causes to arrange, organize, format, or filter the results at the master, regardless of the formats of the results generated by the one or more slaves. In some embodiments, the method or the system for parallelizing tasks in processing an electronic circuit design causes the one or more slaves to format the results.

Figure 7:
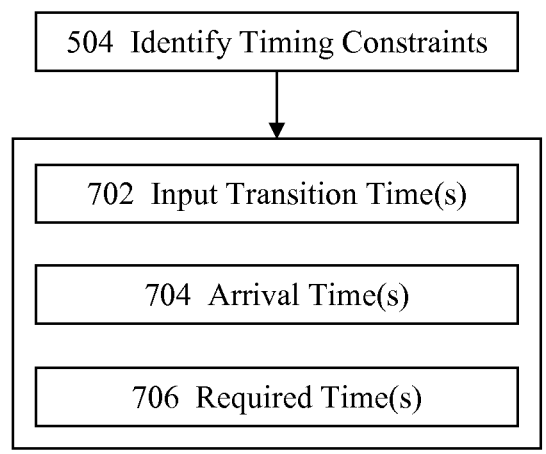
FIG. 7 illustrates more details for the process or the subsystem for identifying timing constraints of the method or the system for parallelizing tasks in processing an electronic circuit design.

Referring to FIG. 7 which illustrates more details for the process or the sub-system for identifying timing constraints of the method or the system for parallelizing tasks in processing an electronic circuit design. In some embodiments, the one or more timing constraints comprise a description of one or more input transition times, 702, and one or more arrival times, 704, at an input boundary of the sub-netlist and one or more required times, 706, on an output boundary of the sub-netlist.

Referring back to FIG. 5. At 506, the method or the system for parallelizing tasks in processing an electronic circuit design identifies or receives one or more actions, operations, or tasks to be performed on a sub-netlist. At 508, the method or the system for parallelizing tasks in processing an electronic circuit design generates a result for 502, 504, or 506 when the one or more actions, operations, or tasks are completed in some embodiments. In some embodiments, the method or the system for parallelizing tasks in processing an electronic circuit design receives the result at the master.

Figure 6:
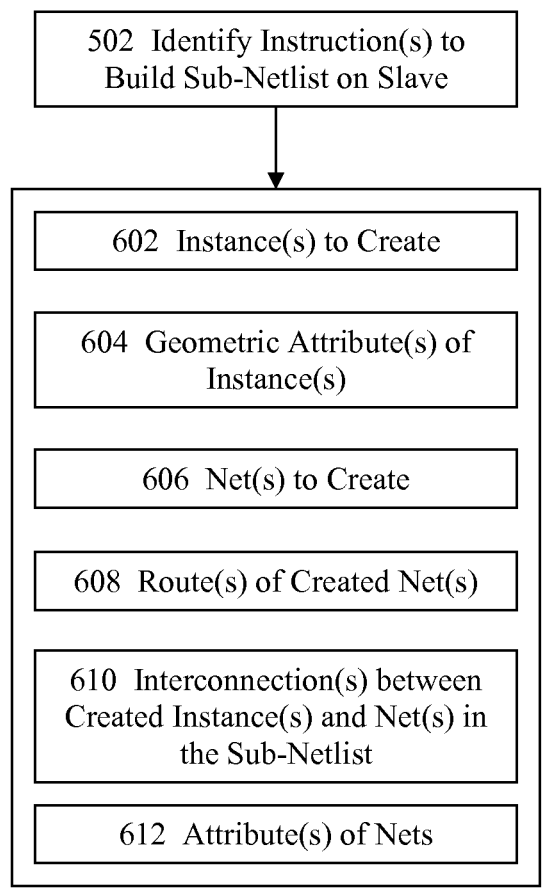
FIG. 6 illustrates more details for the process or the subsystem for identifying one or more instructions to build a sub-netlist on a slave node of the method or the system for parallelizing tasks in processing an electronic circuit design.

Referring to FIG. 6 which illustrates more details for the process or the sub-system for identifying one or more instructions to build a sub-netlist on a slave node of the method or the system for parallelizing tasks in processing an electronic circuit design. At 502, the method or the system for parallelizing tasks in processing an electronic circuit design identifies one or more instructions to build or to receive one or more sub-netlists at some or all of the available slave sessions or LWPSs in some embodiments. In some embodiments, the additional information or data comprise a list of instances to create, 602. In some embodiments, the additional information or data comprise one or more geometric attributes of the one or more instances to be created, 604.

In some embodiments, the one or more geometric attributes comprise a location of an instance to be created. In some embodiments, the one or more geometric attributes comprise an orientation of an instance to be created. In some embodiments, the additional information or data comprise a list of one or more nets to create, 606. In some embodiments, the additional information or data comprise one or more routes for each of the one or more nets to be created, 608. In some embodiments, the additional information or data comprise one or more interconnections between the created one or more instances and one or more nets in the sub-netlist, 610. In some embodiments, the additional information or data comprise one or more attributes of the one or more net(s).

Figure 8:
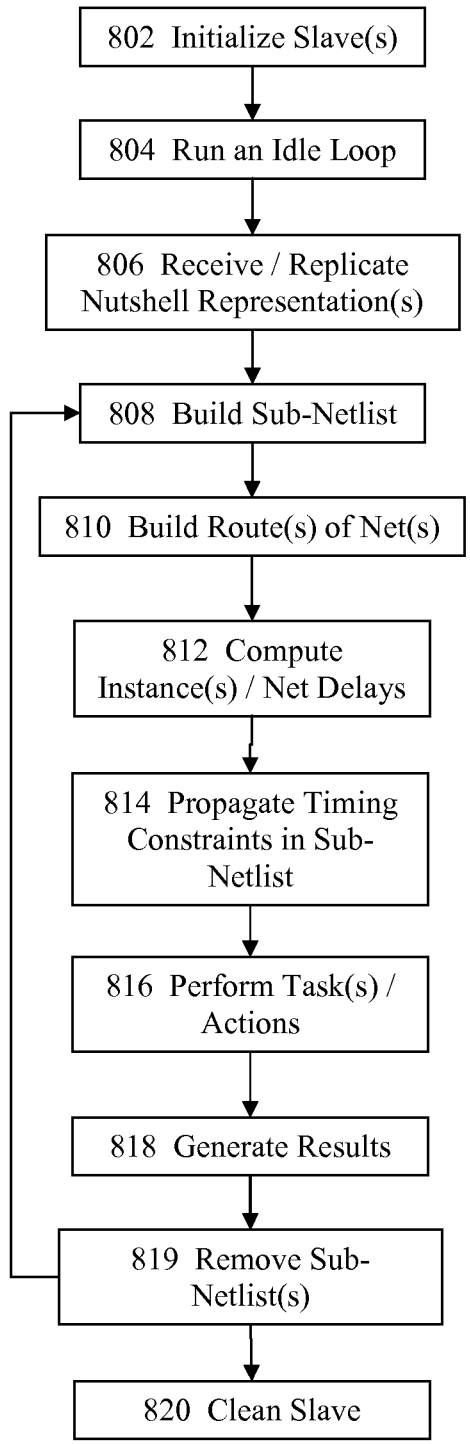
FIG. 8 illustrates a high level block diagram for a method or the system for process tasks in parallel for an electronic circuit design.

Referring to FIG. 8 which illustrates a high level block diagram for a method or the system for process tasks in parallel for an electronic circuit. At 820, the method or the system for process tasks in parallel for an electronic circuit design cleans or causes to clean one or more slave sessions, LWPSs, or one or more sessions for the LWPSs (collectively slaves) in some embodiments. At 804, the method or the system for process tasks in parallel for an electronic circuit design runs or causes to run one or more idle loops in some embodiments.

At 806, the method or the system for process tasks in parallel for an electronic circuit design receives, replicates, causes to receive, or causes to replicate one or more nutshell representations or nutshell designs at the one or more slaves. In some embodiments, all of the one or more slaves receive, replicate, is caused to receive, or is caused to replicate an identical nutshell representation or an identical nutshell design. In some embodiments, some of the one or more slaves receive, replicate, is caused to receive, or is caused to replicate one or more different nutshell representations or nutshell designs each of which represents a portion of the entire electronic circuit design than the remainder of the one or more slaves which collectively receive, replicate, is caused to receive, or is caused to replicate an identical nutshell representation or an identical nutshell design of the remaining portion of the electronic circuit design. In some embodiments, each of the one or more slaves receives, replicates, is caused to receive, or is caused to replicate a different nutshell representation or nutshell design which represents a different portion of the electronic circuit design.

At 808, the method or the system for process tasks in parallel for an electronic circuit design builds, receives or identifies, causes to build, or causes to receive or identify one or more sub-netlists at the one or more slaves. In some embodiments, the method or the system for process tasks in parallel for an electronic circuit design builds, receives or identifies, causes to build, or causes to receive or identify one or more sub-netlists at the one or more slaves based at least upon how the one or more slaves receive or identify, replicate, is caused to receive or identify, or is caused to replicate one or more nutshell representations or nutshell designs. In some embodiments, the method or the system for process tasks in parallel for an electronic circuit design receives, identifies, builds, or is caused to receive, identify, or build one or more nets based at least in part upon the one or more sub-netlists.

For example, in some embodiments where each of the one or more slaves receives or identifies, replicates, is caused to receive, or is caused to replicate a different nutshell representation or nutshell design, each of the one or more slaves receives or identifies, builds, is caused to receive or identify, or is caused to build a different sub-netlist for the portion of the electronic circuit design from which the slave is responsible for processing one or more tasks arising. In some embodiments where some of the slaves receive or identify, replicate, is caused to receive or identify, or is caused to replicate the same nutshell representation or nutshell design, the some of the slaves receive or identify, build, is caused to receive or identify, or is caused to build an identical sub-netlist.

In some embodiments where some of the slaves receive or identify, replicate, is caused to receive or identify, or is caused to replicate the same nutshell representation or nutshell design, at least one of the some of the slaves receives or identifies, builds, is caused to receive or identify, or is caused to build a different nutshell representation than the remainder of the some of the slaves do. In these embodiments, the different nutshell representation or nutshell design built or is caused to be built at the at least one of the some of the slaves represents the portion of the electronic circuit from which the one or more tasks arise for the at least one of the some of the slaves is responsible for processing or executing.

At 810, the method or the system for process tasks in parallel for an electronic circuit design builds or causes to build one or more routes of the one or more nets. In some embodiments, the method or the system for process tasks in parallel for an electronic circuit design further identifies, receives, or is caused to identify or receive one or more instances to be created at 812. In some embodiments, the one or more instances comprise one or more interconnected instances to be created. In some embodiments, the method or the system for process tasks in parallel for an electronic circuit design the computes the delay information or data or the one or more instances for the one or more nets. In some embodiments, the method or the system for process tasks in parallel for an electronic circuit design further asserts or causes to assert one or more constraints on at least one boundary of at least one of the one or more sub-netlists.

At 814, the method or the system for process tasks in parallel for an electronic circuit design propagates or causes to propagate one or more timing constraints in the one or more sub-netlists in some embodiments. In some embodiments, the method or the system for process tasks in parallel for an electronic circuit design propagates one or more arrival times or one or more required times on the one or more sub-netlists.

At 816, the method or the system for process tasks in parallel for an electronic circuit design performs or causes to perform one or more tasks distributed or assigned to the one or more slaves for processing or execution in parallel in some embodiments. In some embodiments, the method or the system for process tasks in parallel for an electronic circuit design further performs or causes to perform one or more optimization tasks on the one or more sub-netlists. In some embodiments, various components may be removed from an optimization task. For example, one or more timing constraints may be removed from an optimization task of pushing a logical database constant through the one or more sub-netlists. As another example, a route description may be removed from a description and may be executed by a slave for optimization where the accuracy of the net capacitances may be associated with relatively minor importance.

At 818, the method or the system for process tasks in parallel for an electronic circuit design generates or causes to generate a result for the processing or execution of the one or more tasks at the one or more slaves in some embodiments. At 819, the method or the system for parallelizing tasks in processing an electronic circuit design removes a sub-netlist from a slave in some embodiments. In some embodiments, the method or the system for parallelizing tasks in processing an electronic circuit design repeatedly goes through the processes or modules of 808-819 to process all the sub-netlists. At 820, the method or the system for process tasks in parallel for an electronic circuit design optionally cleans the one or more slaves to remove some or all of the information or data related to the electronic circuit design in some embodiments. In some embodiments, the method or the system removes, for example, the one or more sub-netlists from the one or more slaves. In some embodiments, the method or the system removes the one or more timing constraints form the one or more slaves. In some embodiments, the method or the system removes the respective nutshell representation from a slave.

Figure 9:
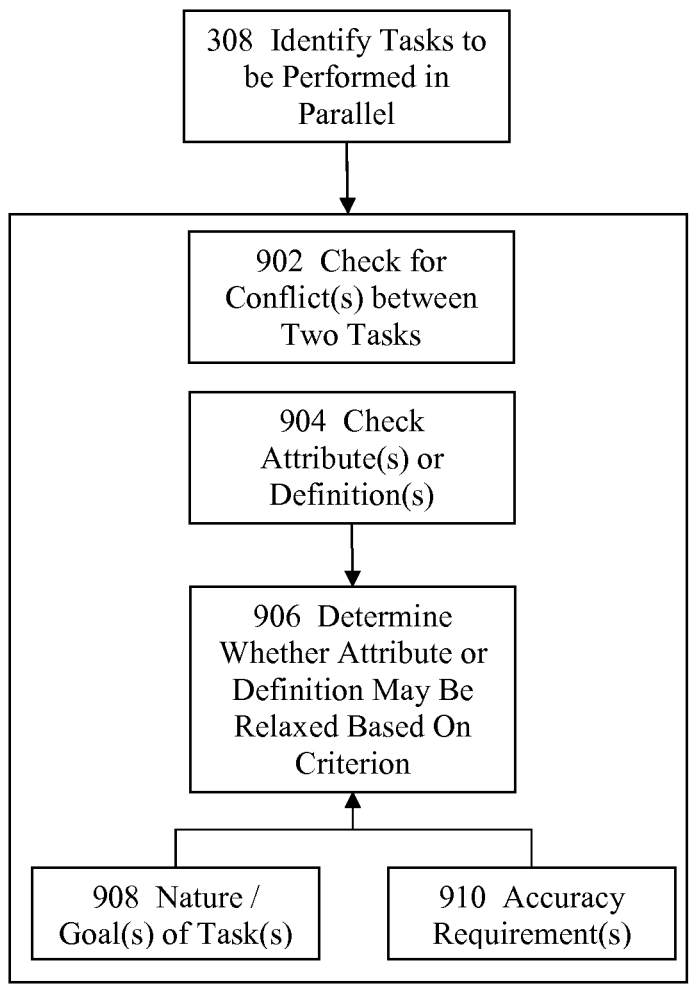
FIG. 9 illustrates more details for a process or a sub-system for identifying tasks to be performed in parallel of the method or the system for parallelizing tasks in processing an electronic circuit design.

Referring to FIG. 9 which illustrates more details for a process or a sub-system for identifying tasks to be performed in parallel of the method or the system for parallelizing tasks in processing an electronic circuit design. At 308, the method or the system for parallelizing tasks in processing an electronic circuit design identifies one or more tasks to be processed or executed in parallel in some embodiments. At 902, the method or the system for parallelizing tasks in processing an electronic circuit design checks for one or more conflicts between two tasks in some embodiments. In some embodiments, the one or more conflicts refer to conflicts in dependency. In some embodiments, the one or more conflicts refer to conflicts in edition of database(s).

At 904, the method or the system for parallelizing tasks in processing an electronic circuit design checks one or more attributes or one or more definitions in some embodiments. In these embodiments, the method or the system for parallelizing tasks in processing an electronic circuit design then determines whether an attribute or a definition may be relaxed based at least in part upon a criterion at 906. In some embodiments, the criterion comprises one or more accuracy requirement, 910. In some embodiments, the criterion comprises the nature or a goal of the task to be processed, 908.

System Architecture Overview

Figure 10:
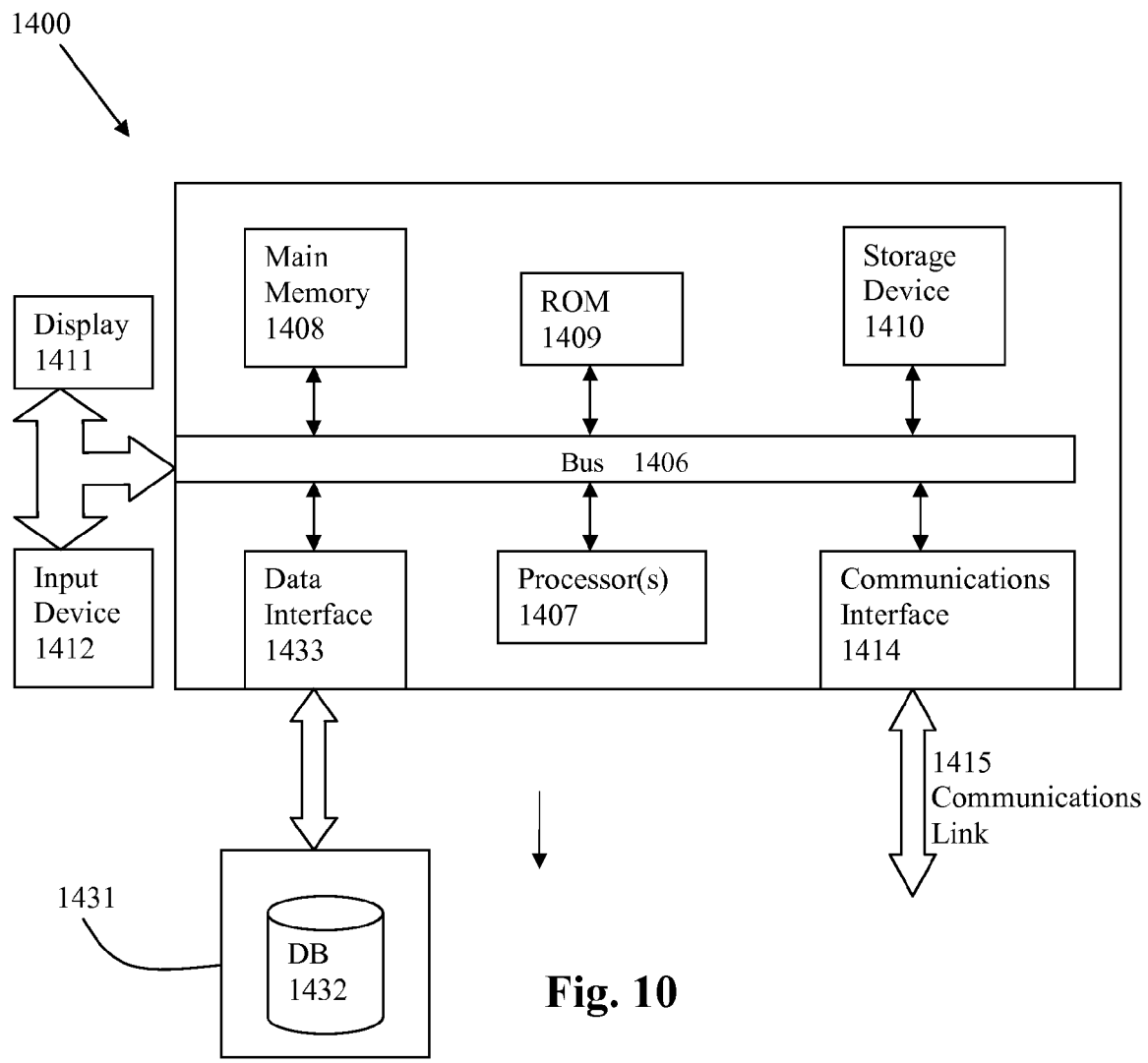
FIG. 10 illustrates a computerized system on which a method for parallelizing tasks in processing an electronic circuit design can be implemented.

FIG. 10 illustrates a block diagram of an illustrative computing system 1400 suitable for implementing various embodiments of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may also interact with a database system 1432 via a data interface 1433 where the computer system 1400 may store and retrieve information or data of the electronic design into and from the database system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A system for parallelizing tasks in processing an electronic circuit design, the system comprising:
    at least one processor that is to:
        initialize a master and a plurality of slaves, in which at least a slave of the plurality of slaves comprises a stateless node;
        identify or determining a nutshell representation of at least a portion of the electronic circuit design, in which the nutshell representation comprises an abstracted representation without full context of the at least a portion of the electronic circuit design;
        identify a task to be processed; and
        cause the task to be processed on at least one of the plurality of slaves based at least in part upon the nutshell representation.

2. The system of claim 1, in which the at least one processor is further to:
    receive or replicating the nutshell representation at the at least one of the plurality of slaves;
    build a sub-netlist of the portion of the electronic design for the at least one of the plurality of slaves;
    build one or more routes of one or more nets according to the sub-netlist; and
    perform the task at the at least one of the plurality of slaves.

3. The system of claim 2, in which the at least one processor that is to build a sub-netlist or to build one or more routes of one or more nets according to the sub-netlist is further to perform at least one of:
    build a net for the sub-netlist;
    build a route for the sub-netlist;
    compute an instance or a net delay; and
    propagate a timing constraint in the sub-netlist.

4. The system of claim 3, in which the at least one processor is further to remove the sub-netlist.

5. The system of claim 1, in which the at least one processor is further to clean the one or more slaves.

6. The system of claim 1, in which the nutshell representation further comprises at least one of the following:
    a density track for the portion of the electronic circuit design; and
    a congestion grid for the portion of the electronic circuit design.

7. The system of claim 1, in which the nutshell representation further comprises at least one of the following:
    a first description of one or more tracks or one or more rows of the portion of the electronic circuit design;
    information about one or more blockages for the portion of the electronic circuit design;
    one or more libraries of the portion of the electronic circuit design; and
    a second description for one or more views and one or more corners for the multi-mode multi-corner (MMMC) mode.

8. The system of claim 1, in which the at least one processor is further to:
    load the electronic circuit design in its entirety at the master; and
    cause to load the nutshell representation at the at least one of the plurality of slaves, wherein the nutshell representation comprises an abstracted representation of the electronic circuit design.

9. The system of claim 1, in which the at least one processor is further to:
    send the task to the at least one of the plurality of slaves based at least upon a scheme; or
    update the nutshell representation based at least in part upon the result of processing the task at the at least one of the plurality of slaves.

10. The system of claim 1, in which the at least one processor is further to:
    perform or cause a slave to perform the task arising out of the at least a portion of the electronic circuit design in parallel; or
    determine whether or not there exists an additional task to be performed.

11. The system of claim 1, in which the at least one processor that is to determine whether or not there exists an additional task to be performed is further to:
    determine whether or not one of the plurality of the slaves is available to process the additional task; and
    queue the additional task, wherein none of the plurality of slaves is available to process the additional task.

12. The system of claim 1, in which the at least one processor is further to:

update the electronic circuit design based at least in part upon the result; or determine whether or not all of one or more of the plurality of the slaves responsible for parallel processing complete processing.

13. The system of claim 1, in which the at least one processor that is to determine whether or not all of one or more of the plurality of the slaves responsible for parallel processing complete processing is further to:

determining whether or not there exists a conflict between a first result generated by a first slave and a second result generated by a second slave.

14. The system of claim 13, in which the at least one processor is further to:

determine whether an attribute or a definition may be relaxed to resolve the conflict.

15. The system of claim 14, in which the processor that is to determine whether the attribute or the definition may be relaxed is to make a determination based at least in part upon a goal of the task or an accuracy requirement.

16. The system of claim 1, in which the at least one processor is further to:

resolving the conflict based at least in part upon a result of updating the electronic circuit design.

17. The system of claim 1, in which the at least one processor that is to cause the task to be processed at the at least one of the plurality of the slaves is further to:

identifying or receiving an additional information for the at least one of the plurality of the slaves.

18. The system of claim 17, in which the additional information comprises at least one of:

an instruction for building a sub-netlist;
a timing constraint;
an action to perform on the sub-netlist; or
a result requirement for the result.

19. The system of claim 18, in which the at least one processor that is to perform on the sub-netlist comprises at least one of is further to:

determining a net for the sub-netlist; or
determining a route for the net.

20. The system of claim 18, in which the instruction for building a sub-netlist comprises at least one of:

an instance to be created;
a geometric attribute of the instance to be created;
a net to be created;
a route for the net to be created;
an interconnection between the instance to be created and the net to be created; or
an attribute of the net to be created.

\* \* \* \* \*